United States Patent [19]

Nagai et al.

[11] Patent Number: 4,833,474
[45] Date of Patent: May 23, 1989

[54] A/D CONVERTER

[75] Inventors: Kenji Nagai, Hamura; Masayuki Yamashita, Higashimurayama; Masafumi Kanagawa, Ohme; Mitsumasa Sato, Ohme; Tsuneo Ito, Ohme, all of Japan

[73] Assignees: Hitachi Ltd.; Hitachi VLSI Engineering Corp., both of Tokyo, Japan

[21] Appl. No.: 88,418

[22] Filed: Aug. 24, 1987

[30] Foreign Application Priority Data

Aug. 25, 1986 [JP] Japan .................................. 61-197178
Oct. 24, 1986 [JP] Japan .................................. 61-251722
Oct. 24, 1986 [JP] Japan .................................. 61-251723
Oct. 24, 1986 [JP] Japan .................................. 61-251732

[51] Int. Cl.$^4$ .......................................... H03M 1/50
[52] U.S. Cl. .................................. 341/166; 364/724.1
[58] Field of Search ................ 340/347 AD; 364/724; 375/25, 26, 27, 28; 341/166

[56] References Cited

U.S. PATENT DOCUMENTS

4,684,925  8/1987  Maruta ........................ 340/347 AD

Primary Examiner—William M. Shoop, Jr.
Assistant Examiner—Marc S. Hoff
Attorney, Agent, or Firm—Antonelli, Terry & Wands

[57] ABSTRACT

An A/D converter apparatus comprises: a sampling signal generating means to generate an oversampling signal and an internal sampling signal; a converter means to convert an input analog signal into a digital signal in synchronism with the oversampling signal; and a decimator means to perform a specified decimation on the digital signal in synchronism with the internal sampling signal; whereby the sampling signal generating means maintains the frequencies of the oversampling signal and the internal sampling signal in a specified relationship.

17 Claims, 7 Drawing Sheets

A/D CONVERTER

BACKGROUND OF THE INVENTION

The present invention relates to an A/D and D/A converter which is effectively utilized in A/D and D/A converters equipment employing, for instance, an oversampling type $\Delta - \Sigma$ method.

In the oversampling $\Delta - \Sigma$ type A/D and D/A converter as used in MODEMs and CODECs, input analog signals are sampled by oversampling clock signals whose frequency is an integral multiple of that of the sampling clock signal and are converted into digital signals which are then subjected to a specified weighting processing to extract output digital signals having an increased number of bits. The number of bits of the input digital signal synchronized with the sampling clock signal is compacted by an error integrating circuit to form a digital signal in synchronism with the oversampling clock signal, which digital signal is then converted into an output analog signal. In this way, a simple and high-performance A/D and D/A converter circuit is achieved. Such oversampling $\Delta - \Sigma$ type A/D and D/A converters are introduced, for example, in the electrical communication engineers journal "Denki Tsushin Gakkai Shi", featuring the papers to be presented at the national congress of the electrical communication engineers association (communication field), No. 603,604.

Figure 2:
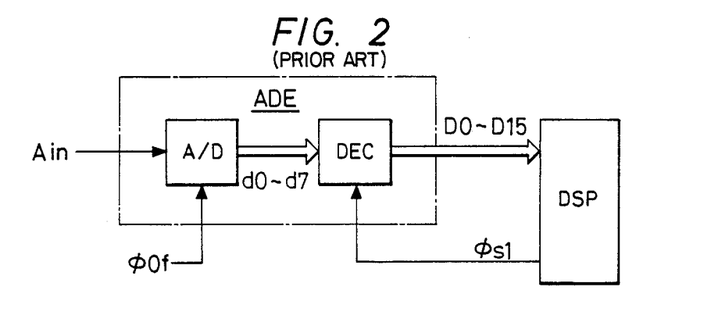
FIG. 2 is a block diagram of the conventional A/D converter.

FIG. 2 shows the block diagram of one example of the conventional oversampling $\Delta - \Sigma$ type A/D converter ADE of this kind. The input analog signal Ain is applied to the A/D converter circuit of the A/D converter ADE where it is sampled according to the oversampling clock signal $\phi$of. The oversampling signal $\phi$of is supplied from a crystal oscillator in the converter and has a fixed frequency of 1.2288 MHz, for example. The A/D converter circuit A/D, in response to the oversampling clock signal $\phi$of, samples the input analog signal Ain to transform the input signal into, for instance, an 8-bit digital signal d0–d7. The digital signal d0–d7 formed in each cycle of the oversampling clock signal $\phi$of is weighted and decimated according to the sampling clock signal $\phi$s1 by a decimator circuit DEC. The sampling clock signal $\phi$s1 has a fixed frequency of 9.6 kHz, for example. The decimator circuit DEC, using 128 sets of digital signals d0–d7 corresponding to one cycle of the sampling clock signal $\phi$s1, forms a 16-bit output digital signal D0–D15.

As the sampling clock signal $\phi$s1 and the oversampling clock signal $\phi$of both have fixed frequencies, the 128 sets of digital signals d0–d7 can always be related to one set of the output digital signal D0–D15. The decimating processing of the decimator circuit DEC is implemented by hardware formed according to the above architecture.

However, as shown in FIG. 2, when the output digital signal D0–D15 from the A/D converter ADE is supplied to the digital signal processor DSP for modulation or demodulation, the digital signal processor DSP extracts the sampling clock signal $\phi$s1 from the input signal components. During the course of this processing, to adjust the synchronism between the sampling clock signal $\phi$s1 and the input signal, it may become necessary to shift the phase (frequency) of the sampling clock signal $\phi$s1.

As explained above, the decimating processing of the cimator circuit DEC requires that the frequency ratio of the sampling clock signal $\phi$s1 and the oversampling clock signal $\phi$of be in a stable relationship. Thus, if the digital signal d0–d7 goes out of phase with the output digital signal D0–D15 as a result of phase correction performed by the digital signal processor DSP, causing the number of oversamplings to change, the calculation for the weighting and decimating processing will not be carried out correctly. This in turn will deteriorate the S/N ratio of the MODE as a whole including the A/D converter ADE.

The objective of this invention is to provide oversampling type A/D and D/A converter with an enhanced operational stability and improved S/N ratio.

The above and other objectives and novel features of this invention, will become apparent from the following detailed description and attached drawings.

A typical example, of the invention disclosed in this application has a phase licked loop PLL circuit that synchronizes two signals—the oversampling clock signal supplied to the A/D converter circuit of the A/D and D/A converter using the oversampling method and the internal sampling clock signal supplied to the decimator circuit—with a sampling clock signal supplied from an external circuit.

With this means, since the sampling clock signal and the oversampling clock signal are synchronized in phase, the output digital signal from the A/D converter circuit, the output digital signal from the decimator circuit, and the data processing performed by the digital signal processor can all be synchronized, which contributes to improved stability of demodulation processing and a better S/N ratio of the MODEM equipment as a whole.

DESCRIPTION OF THE PREFERRED EMBODIMENT

Figure 1:
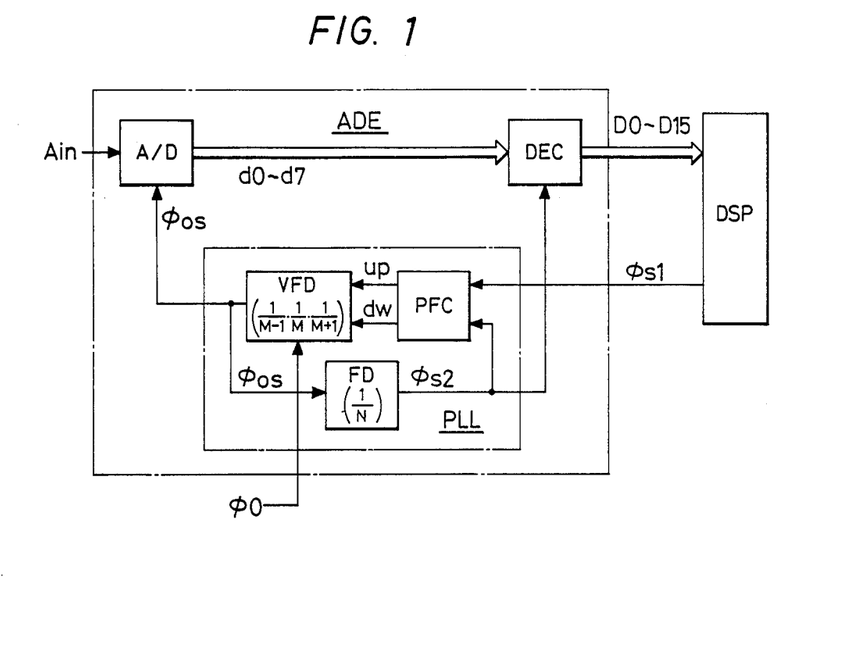
FIG. 1 is a block diagram of one embodiment of the A/D converter according to this invention.

FIG. 1 shows a block diagram of one embodiment of the A/D converter ADE to which the present invention is applied. The circuit elements making up each of the blocks are formed on, though not limited to, a single semiconductor substrate of a material such as monocrystal silicon by utilizing a known MOS integrated circuit manufacturing technique.

FIG. 1 illustrates circuit blocks associated with the A/D converter circuit section of the A/D converter ADE. The block configuration and operation of the D/A converter are similar to those of the A/D converter of FIG. 1, except that the direction of the signals is reverse and the D/A converter employs an interpolator instead of the decimator in the A/D converter. Now, we will explain the outline of the A/D converter ADE to which this invention is applied, centering around the A/D converter section.

Figure 12:
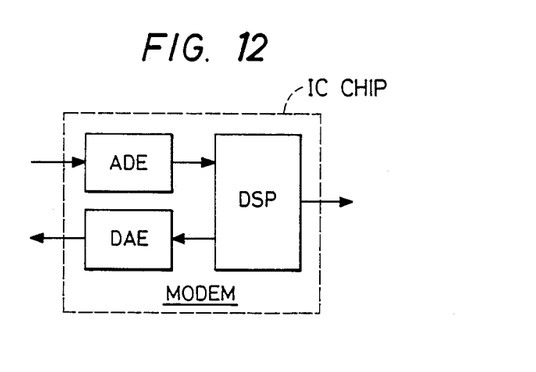
FIG. 12 is a block diagram of the MODEM to which this invention is applied.

The A/D converter ADE is incorporated in, though not restricted to, a modulator/demodulator (MODEM) which performs digital data transmission through a telephone communication circuit. FIG. 12 shows the configuration of the 1-chip MODEM to which this invention is applied. The MODEM contains an A/D converter ADE, a D/A converter DAE and a digital signal processor DSP. In this communication system, digital data output from data terminal equipment is converted into analog signal form by phase-modulating the carrier signal of a voice band frequency of 1800 Hz, for example, and the converted analog signal is transmitted over the telephone communication circuit.

Looking again to FIG. 1, an input analog signal Ain, which was transmitted over the telephone circuit and isolated from the output analog signal by a hybrid circuit (not shown), is applied to the A/D converter circuit A/D of the A/D converter ADE. The A/D converter circuit A/D is supplied with oversampling clock signals $\phi$os from a PLL circuit PLL (described later). The A/D converter circuit A/D, according to the oversampling clock signal $\phi$os, samples the input analog signal Ain and converts it into, for example, an 8-bit digital signal, d0–d7. The eight digital signals d0–d7 are applied in parallel to the decimator circuit DEC.

The decimator circuit DEC, according to the internal sampling clock signal $\phi$s2 supplied from the PLL circuit PLL, decimates the digital signal d0–d7 coming from the A/D converter circuit A/D. As described earlier, the input analog signal Ain has a voice band frequency and the center frequency of the fundamental sampling rate of the MODEM in this embodiment, i.e., the center frequency of the sampling clock signal $\phi$s1 is set at, 9.6 kHz, for example. To enhance the sampling accuracy and improve the S/N ratio, the sampling operation of the A/D converter A/D is performed according to a very high frequency oversampling clock signal $\phi$os which has a center frequency of 1.2288 MHz, 128 times the sampling clock signal $\phi$s1. Through this sampling an 8-bit digital signal d0–d7 is formed. The decimator circuit DEC, according to the internal sampling clock signal $\phi$s2, recognizes 128 sets of digital signals d0–d7 corresponding to one cycle of the internal sampling clock signal $\phi$s2, performs weighting on the sampled digital signals, takes an average and extracts the necessary data. The 16-bit output digital signal D0–D15 of the decimator circuit DEC is transferred to the digital signal processor DSP as an output of the A/D converter ADE.

The digital signal processor DSP uses, for example, a stored program control scheme. The digital signal processor DSP accepts the digital signal D0–D15 output from the A/D converter ADE in synchronism with the internal sampling clock signal $\phi$s2 and, according to a specified demodulation program, reproduces the digital data sent from the data terminal equipment on the sending side. In the course of the demodulation processing, the digital signal processor DSP extracts sampling clock signals $\phi$s1 of 9.6 kHz from the output digital signals D0–D15 and supplies them to the PLL circuit PLL. The demodulated digital data is then supplied to data terminal equipment or a computer on the receiving side.

The PLL circuit PLL of the A/D converter ADE comprises: a phase comparison circuit PFC to compare the sampling clock signal $\phi$s1 fed from the digital signal processor DSP with the internal sampling clock signal $\phi$s2 produced within the PLL circuit PLL; a variable frequency dividing circuit VFD to divide the reference frequency signal $\phi$o according to a dividing factor specified by the phase control signal output from the phase comparison circuit PFC and thereby form the oversampling clock signal $\phi$os; and a frequency dividing circuit FD to divide the oversampling clock signal $\phi$os according to a specified dividing factor and thereby form the above internal sampling clock signal $\phi$s2.

The variable frequency dividing circuit VFD is supplied with, though not limited to, a reference frequency signal $\phi$o generated by a crystal oscillator circuit. The reference frequency signal $\phi$o is set to a fixed frequency of 7.3728 MHz for example. The dividing factor of the variable frequency dividing circuit VFD has three steps $1/(M-1)$, $1/M$ and $1/(M+1)$, $1/M$ being a center value. In this example the circuit VFD is set to have three variable dividing factors 1/5, 1/6 and 1/7. The dividing factor of the variable frequency dividing circuit VFD is set to 1/6 in the phase-locked state and is shifted to 1/5 or 1/7 by an up signal up or a down signal dw given by the phase comparison circuit PFC. When the dividing factor of the variable frequency dividing circuit VFD is 1/6, the frequency of the oversampling clock signal $\phi$os, i.e., the center frequency is set to 1.2288 MHz.

The oversampling clock signal $\phi$os output from the variable frequency dividing circuit VFD is supplied to the A/D converter circuit A/D and also to the frequency dividing circuit FD where it is further divided to form the internal sampling clock signal $\phi$s2. The dividing factor of the frequency dividing circuit FD is set to a fixed value of 1/N, which may be for example 1/128. Thus the center frequency of the internal sampling clock signal $\phi$s2 is 9.6 kHz.

The internal sampling clock signal $\phi$s2 is supplied to the decimator circuit DEC of the A/D converter ADE and also to one of the inputs of the phase comparison circuit PFC. At the other input the phase comparison circuit PFC receives the sampling clock signal $\phi$s1 generated by the digital signal processor DSP.

The phase comparison circuit PFC compares the sampling clock signal $\phi$s1 and the internal sampling clock signal $\phi$s2 and, according to the difference in phase, generates the up signal up or down signal dw—a phase control signal to control the dividing factor of the variable frequency dividing circuit VFD. The up signal up goes high when the internal sampling clock signal $\phi$s2 lags the sampling clock signal $\phi$s1. The down signal dw goes high when the internal sampling signal $\phi$s2 leads the sampling clock signal $\phi$s1. In practice, as the sampling clock signal $\phi$s1 and the internal sampling clock signal $\phi$s2 are generated on the basis of output signals from the very stable crystal oscillator circuit, the phase difference between these two sampling clock signals is as small as approximately one cycle of the oversampling clock signal $\phi os$, that is, about 1/128 of the sampling clock signal $\phi s1$.

The up and down signals up, dw issued from the phase comparison circuit PFC are fed as phase control signal to the variable frequency circuit VFD.

Receiving the reference frequency signal $\phi o$ of 7.3728 MHz, the variable frequency dividing circuit VFD divides it by the factor specified by the phase control signal to generate the oversampling clock signal $\phi os$. As mentioned earlier, the variable frequency dividing circuit VFD has three variable dividing factors of 1/5, 1/6 and 1/7. The dividing factor of the circuit VFD is increased from 1/6 to 1/5 by the up signal up supplied as the phase control signal from the phase comparison circuit PFC. As a result the phase of the oversampling clock signal $\phi os$ is advanced. The down signal dw output from the phase comparison circuit PFC reduces the dividing factor from 1/6 to 1/7, delaying the phase of the oversampling clock signal $\phi os$. The dividing factor of the variable frequency dividing circuit VFD is changed for each of specified cycles k, for instance six cycles, of the oversampling clock signal $\phi os$.

The oversampling clock signal $\phi os$ generated by the variable frequency dividing circuit VFD is divided by the frequency dividing circuit FD using a fixed dividing factor of 1/128 to form the internal sampling clock signal $\phi s2$. Thus the center frequency of the internal sampling clock signal $\phi s2$ is 1/128 of 1.2288 MHz, or 9.6 kHz.

The dividing factor of the variable frequency dividing circuit VFD is held constant for six cycles of the oversampling clock signal $\phi os$, so that the phase of the internal sampling clock signal $\phi s2$ is controlled within a range of $\pm 1$ cycle of the oversampling clock signal $\phi os$, i.e., $\pm 1/128$ cycle of the internal sampling clock signal $\phi s2$. As mentioned earlier, since the phase difference between the sampling clock signal $\phi s1$ and the internal sampling clock signal $\phi s2$ is at most about one cycle of the oversampling clock signal $\phi os$, the internal sampling clock signal $\phi s2$ can be made to come into phase with the sampling clock signal $\phi s1$ by changing the dividing factor of the variable frequency dividing factor VFD in the range of 1/5 to 1/7.

In this way, in the A/D converter of this embodiment the oversampling clock signal $\phi os$ supplied to the A/D converter circuit A/D and the internal sampling clock signal $\phi s2$ supplied to the decimator circuit DEC are synchronized in phase with the sampling clock signal $\phi s1$ extracted by the digital signal processor DSP. Thus, when the sampling clock signal $\phi s2$ applied to the decimator circuit DEC is varied in phase according to the phase of the data transmitted over the communication line, the oversampling clock signal $\phi os$ is also changed, following the phase variation of the data. As a result, the three processings—the A/D conversion processing performed by the A/D converter circuit A/D according to the oversampling clock signal $\phi os$, the decimating processing performed by the decimator circuit DEC according to the internal sampling clock signal $\phi s2$, and the modulation/demodulation processing performed by the digital signal processor DSP according to the sampling clock signal $\phi s1$—are all synchronized. This ensures the normal operation of modulation/demodulation processing in the MODEM as a whole even when the sampling clock signal is corrected or shifted in phase by the digital signal processor DSP, improving the signal transmission characteristics of the MODEM.

To summarize, the invention when applied to A/D and D/A of the type used in MODEMs has the following advantages.

(1) As the PLL circuit is provided in the A/D and D/A converters using the oversampling method to synchronize two sampling signals—the oversampling clock signal applied to the A/D converter circuit and the internal sampling clock signal fed to the decimator circuit—with the sampling clock signal extracted by the digital signal processor, the decimator processing by the decimator circuit and the data processing by the digital signal processor can be synchronized with the digital signal output from the A/D converter circuit and with the digital signal output from the decimator circuit, respectively. This contributes to keeping the oversampling number constant, which makes it possible to stabilize the modulation/demodulation processing of the MODEM as a whole, including the A/D and D/A converters using the oversampling scheme, even when the sampling clock signal is phase-corrected by the digital signal processor DSP. This in turn prevents erroneous operation of the MODEM.

(2) Thanks to the features mentioned in the above item (1), the S/N ratio of the MODEM as a whole, including the A/D and D/A converters using the oversampling scheme, can be improved.

(3) Because of the above items (1) and (2), it is possible to eliminate the channel filters and AGC (automatic gain control) circuit, resulting in a simplified circuit configuration of the MODEM and reduced chip area.

In the foregoing one embodiment of this invention was explained in detail. It is noted that this invention is not limited to the above embodiment alone and various modifications may be made without deviating from the essence of the invention.

For example, in FIG. 1 the ratio of the oversampling clock signal $\phi os$ and the sampling clock signal $\phi s1$, i.e., the oversampling number may be other than 128. The variable frequency dividing circuit VFD may be a variable frequency oscillator circuit which has its frequency directly controlled by the phase control signal up or dw output from the phase comparison circuit PFC. Furthermore, the PLL circuit of the A/D and D/A converters ADE may be an analog type PLL circuit instead of the digital PLL circuit PLL.

While the above description concerns the case where the invention is applied to the A/D and D/A converters of the MODEM in which the invention has originated, the application of the invention of course is not so limited, but can also include similar A/D and D/A converters used in other digital data transmission equipment. This invention is widely applicable to A/D and D/A converters using the oversampling scheme and also to semiconductor equipment incorporating such A/D and D/A converters.

Figure 3:
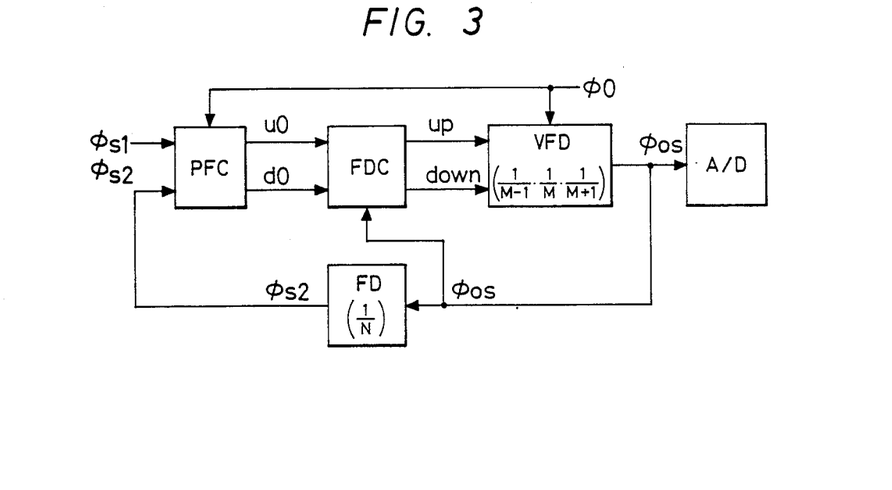
FIG. 3 is a block diagram showing another embodiment of the PLL circuit as shown in FIG. 1.

FIG. 3 is directed to another embodiment of this invention in which improvement is made in the PLL circuit of FIG. 1.

We have found that the digital PLL circuit of FIG. 1 still has room for improvement. The phase comparison circuit PFC compares the reference input clock signal $\phi s1$ and the internal clock signal $\phi s2$ at their leading edges of the cycle. When a phase difference occurs between the reference input clock signal $\phi s1$ and the internal clock signal $\phi s2$ at their leading edges, the phase difference signal up or dw is set to a high level. As the phase difference signal up or dw goes high, the variable frequency dividing circuit VFD changes its dividing factor to 1/5 or 1/7 and maintains it until the next phase comparison is performed at the next cycle of the reference input clock signal $\phi$s1 and the internal clock signal $\phi$s2. Thus, even when the phase difference between the reference input clock signal $\phi$s1 and the internal clock signal $\phi$s2 is relatively small, there is a possibility of the phase (frequency) of the second reference frequency signal $\phi$os, or sampling clock signal $\phi$os of the A/D and D/A converter ADE being changed to a relatively large extent. In other words, in the event of a temporary phase fluctuation due to jitter that may occur after phase synchronization is established, the oversampling type A/D and D/A converters ADE are likely to have their sampling timing varied relatively largely, thereby deteriorating the S/N ratio of the entire communication system.

This embodiment of the PLL circuit is characterized in that the dividing factor of the variable frequency dividing circuit is set, during normal condition, to a first dividing factor or a center value and that when the phase difference between the reference input clock signal and the internal clock signal reaches a certain magnitude equivalent to a specified number of reference frequency signal cycles, the dividing factor is changed to a second or third dividing factor by a first or second phase control signal formed when the phase difference occurs, and is held there for the duration lasting the same number of frequency-divided periods as that specified number of reference frequency signal cycles used for phase difference check.

With the above means, when the phase difference between the reference input clock signal and the internal clock signal reaches a value corresponding to the specified number of cycles of the reference frequency signal, phase correction is effected by an amount corresponding to that phase difference, so that the phases (frequencies) of the sampling clock signal and the internal clock signal are not varied excessively. This configuration also assures that the sampling timing of the oversampling type A/D and D/A converters is not changed too sharply to establish synchronism, thereby preventing deterioration of the S/N ratio of the communication system in the oversampling type A/D and D/A converters that would otherwise result from a temporary phase fluctuation due to jitter.

The digital PLL circuit of this embodiment has a frequency dividing factor control circuit FDC installed between the phase comparison circuit PFC and the variable frequency dividing circuit VFD. The phase comparison circuit PFC is supplied with a reference frequency signal $\phi$o. When the phase difference between the reference input clock signal $\phi$s1 and the internal clock signal $\phi$s2 reaches a magnitude equivalent to six cycles, of the reference frequency signal $\phi$o, for example, the phase comparison circuit PFC sets the phase difference signal uo (first phase difference signal) or do (second phase difference signal) to high level. The frequency dividing factor control circuit FDC, according to the phase difference signal uo or do output from the phase comparison circuit PFC, generates a phase control signal up (first phase control signal) or down (second phase control signal). The phase control signals up and down are set to the high level only for such a short duration as to make the dividing factor of the variable frequency dividing circuit VFD change for the duration equal to the same number of frequency-divided periods—six dividing periods—as that specified number of first frequency signal cycles used for phase difference check by the phase comparison circuit PFC. Therefore, when a temporary phase variation occurs due to jitter, the sampling timing of the oversampling type A/D and D/A converters can be prevented from being changed too sharply to establish phase synchronization, thereby preventing deterioration of the S/N ratio of the communication system.

The phase comparison circuit PFC compares the phase (frequency) of the leading edges of the reference input clock signal $\phi$s1 and the internal clock signal $\phi$s2. When the phase difference exceeds a certain magnitude, the phase comparison circuit PFC produces a phase difference signal uo or do. The phase difference signal uo is made to go high when the leading edge of the internal clock signal $\phi$o2 lags the reference input clock signal $\phi$s1 by six cycles or more of the reference frequency signal $\phi$o. The other phase difference signal do is set to the high level when the leading edge of the internal clock signal $\phi$s2 leads the reference input clock signal $\phi$s1 by six cycles or more of the reference frequency signal $\phi$o. These phase difference signals uo and do are left high until the next phase comparison is made at the leading edges of the next cycle of the reference input clock signal $\phi$s1 and the internal clock signal $\phi$s2. The phase difference signals uo and do are supplied to the frequency dividing factor control circuit FDC.

Figure 4:
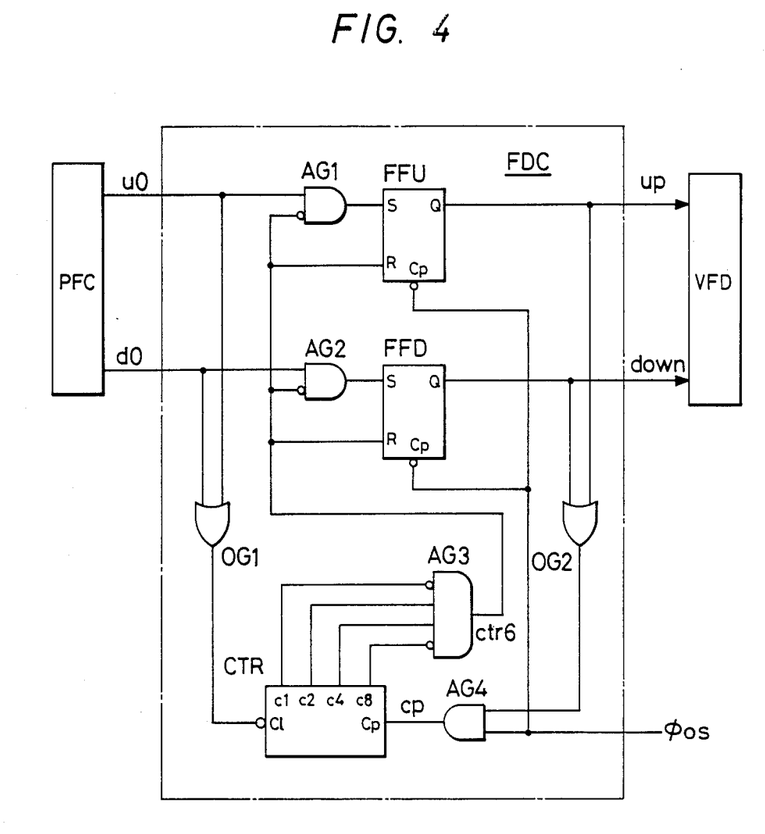
FIG. 4 is a circuitry showing one embodiment of the frequency dividing factor control circuit FDC as shown in FIG. 3.

FIG. 4 shows one embodiment of the frequency dividing factor control circuit FDC of the digital PLL circuit as shown in FIG. 3. In this figure, the phase difference signals uo and do output from the phase comparison circuit PFC are supplied to one input terminal of each of the associated AND gates AG1 and AG2 respectively and also are applied to both the first and second input terminals of OR gate OG1. To the other input terminals of the AND gates AG1 and AG2 there is supplied an inverted signal of the output ctr6 of AND gate AG3. The outputs of the AND gates AG1 and AG2 are high when the output ctr6 of the AND gate AG3 is low and the corresponding phase difference signal uo or do is high.

The output of the AND gate AG1 is fed to the set input terminal of flip-flop FFU. To the reset input terminal of the flip-flop FFU is applied the output ctr6 of the AND gate AG3. At its clock input terminal the flip-flop FFU is supplied with an inverted signal of the sampling clock signal $\phi$os. The flip-flop FFU is set at the high-to-low transition of the sampling clock signal $\phi$os when the output of the AND gate AG1 is high, i.e., when the output ctr6 of the AND gate AG3 is low and the phase difference signal uo is high.

When the output ctr6 of the AND gate 3 goes high, the flip-flop FFU is reset at the high-to-low transition of the sampling clock signal $\phi$os. The non-inverted output signal of the flip-flop FFU is supplied as the phase control signal up to the variable frequency dividing circuit VFD and also to one input terminal of OR gate OG2.

Likewise, the output of the AND gate AG2 is given to the set input terminal of the flip-flop FFD. To the reset input terminal of the flip-flop FFD is supplied the output ctr6 of the AND gate AG3. At its clock input terminal the flip-flop FFD there is applied the inverted signal of the sampling clock signal $\phi$os. Now, the flip-flop FFD is set at the trailing edge of the sampling clock signal $\phi$os when the output of the AND gate AG2 is high, i.e., when the output ctr6 of the AND gate AG3 is low and the phase difference signal do is high.

When the output ctr6 of the AND gate AG3 goes high, the flip-flop FFD is reset at the trailing edge of the sampling clock signal $\phi$os. The non-inverted signal of the flip-flop FFD is supplied as the phase control signal down to the variable frequency dividing circuit VFD and also to the other input terminal of the OR gate OG2.

The output of the OR gate OG2 is fed to one input terminal of the AND gate AG4. To the other input terminal of the AND gate AG4 is supplied the sampling clock signal $\phi$os. The sampling clock signal $\phi$os is inverted and supplied to the clock input terminals of the flip-flops FFU and FFD. The output of the AND gate AG4 is given as a counter clock signal cp to the clock input terminal Cp of the counter circuit CTR. When the output of the OR gate OG2 is high, i.e., when either the phase control signal up or down is high, the sampling clock signal $\phi$os generated while the frequency dividing factor of the variable frequency dividing circuit VFD is set to 1/5 or 1/7 is taken in as the counter clock signal cp.

The counter circuit CTR is formed of, though not limited to, a four-bit binary counter which counts the number of sampling clock signals $\phi$os produced after the counter clock signal cp goes high, i.e., after either the phase control signal up or down goes high. The outputs of the first and fourth bits cl, c8 of the counter circuit CTR are inverted before being supplied to the first and fourth input terminals of the AND gate AG3, respectively. The outputs of the second and third bits of the counter circuit CTR are fed to the second and third input terminals of the AND gate AG3. Now, when the count value of the counter circuit CTR reaches "0110" i.e., six in decimal notation, the output ctr6 of the AND gate AG3 becomes high. The output ctr6 of the AND gate AG3, as explained earlier, is supplied to the reset input terminals of the flip-flops FFU and FFD and also its inverted signal is applied to one input terminal of each of the AND gates AG1 and AG2. To the clear terminal CL of the counter circuit CTR is applied an inverted output of the OR gate OG1.

Therefore, the output ctr6 of the AND gate AG3 goes high when the count value of the counter circuit CTR becomes "6", that is, when the sixth sampling clock signal $\phi$os is produced after the phase control signal up or down has gone high and changed the frequency dividing factor of the variable frequency dividing circuit VFD to 1/5 or 1/7. With the output ctr6 of the AND gate AG3 set to high level, the flip-flops FFU and FFD have their reset input terminals held high and the outputs of the AND gates AG1 and AG2, i.e., the set input terminals of the flip-flops FFU and FFD go low. This causes the flip-flops FFU and FFD to reset at the trailing edge of the sampling clock signal $\phi$os. With these flip-flops FFU and FFD reset, the phase control signals up and down go low, causing the dividing factor of the variable frequency dividing circuit VFD to return to its center value 1/6.

As both the phase control signals up and down go low, the output of the AND gate AG4 is not produced, in other words, the counter clock signal cp for the counter circuit CTR is not generated, with the result that the counter circuit CTR is stopped so as to maintain its count value at "6". Then when both the phase difference signals uo and do from the phase comparison circuit PFC go low and the output of OR gate OG1 becomes low, the clear terminal CL of the counter circuit CTR becomes high, clearing the counter circuit CTR.

With the counter circuit CTR cleared, the outputs cl through c8 of the first to fourth bits of the counter circuit CTR are all set to the low level. This in turn triggers the output ctr6 of the AND gate AG3 into the low level and one input of each of the AND gates AG1 and AG2 into the high level. As a result the flip-flops FFU and FFD are now ready to be set by the next phase difference signals uo and do going high.

When the phase comparison circuit PFC detects a specified phase difference between the reference input clock signal $\phi$s1 and the internal clock signal $\phi$s2—a phase difference equal to six cycles or more of the reference frequency signal 0—and the phase difference signal uo or do goes high, then the flip-flop FFU or FFD in the frequency dividing factor control circuit FDC is set at the trailing edge of the sampling clock signal $\phi$os, sending the phase control signal up or down to the high level. At the inception of the low-to-high transition of the sampling clock signal $\phi$os, the dividing factor of the variable frequency dividing circuit VFD is changed to 1/5 or 1/7, advancing or delaying the phase of the sampling clock signal $\phi$os by one cycle of the reference frequency signal $\phi$o for each frequency-divided period.

The flip-flops FFU and FFD are reset when the output ctr6 of the AND gate AG3 goes high at the leading edge of the sixth sampling clock signal $\phi$os generated after the dividing factor has been changed. The counter circuit CTR 6 holds the count value "6" for the duration in which the phase difference signal uo or do from the phase comparison circuit PFC is high, i.e., until another phase comparison is performed at the next leading edges of the reference input clock signal $\phi$s1 and the internal clock signal $\phi$s2. As a result, the dividing factor of the variable frequency dividing circuit VFD is changed for the duration of six frequency-divided periods in one cycle of the reference input clock signal $\phi$s1 and the internal clock signal $\phi$s2. Thus, the phases of the sampling clock signal Oos and the internal clock signal $\phi$s2 are advanced or delayed by six cycles of the reference frequency signal $\phi$o. As a result, the reference input clock signal $\phi$s1 and the internal clock signal $\phi$s2 are almost synchronized in phase at the leading edges of the next cycle.

Figure 5:
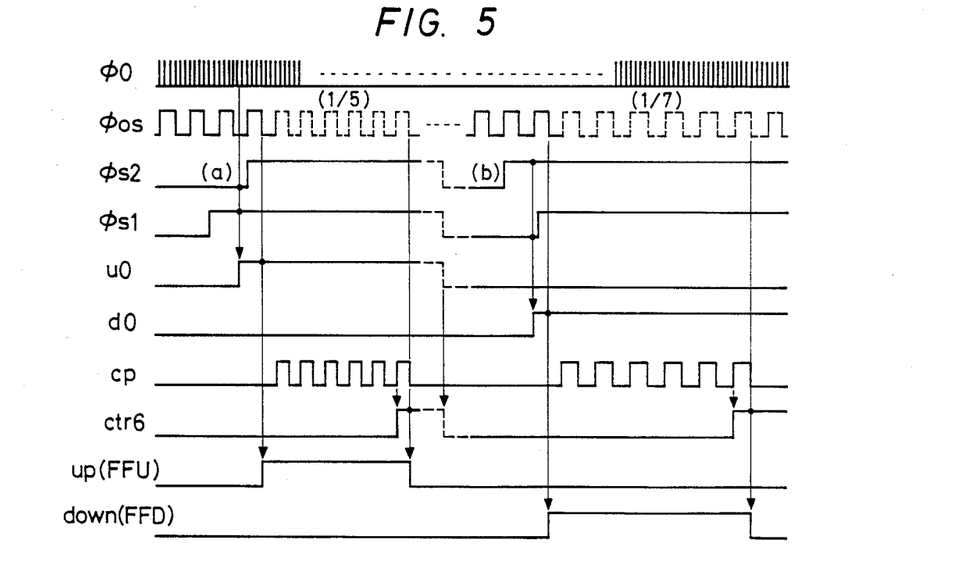
FIG. 5 is timing waveforms showing the operation of the PLL circuit of FIG. 3.

FIG. 5 shows a timing waveform of one embodiment of the digital PLL circuit. Referring to this timing waveform, the outline of the phase control operation performed by the digital PLL circuit of this embodiment is explained.

In FIG. 5, the reference frequency signal $\phi$o is set at 7.3728 MHz. The reference frequency signal $\phi$o is normally divided by the factor of 1/6 in the variable frequency dividing circuit VFD to form the sampling clock signal $\phi$os (first internal clock signal) with its center frequency of 1.2288 MHz. The sampling clock signal $\phi$os is supplied to the A/D converter circuit A/D and is also divided by the frequency dividing circuit FD by the fixed factor of 1/128 to form an internal clock signal $\phi$s2 with its center frequency of 9.6 kHz.

As shown at (a) of FIG. 5, when the phase of the internal clock signal $\phi$s2 lags that of the reference input clock signal $\phi$s1 and the phase difference reaches a magnitude equivalent to six cycles of the reference frequency signal $\phi$o, the phase difference signal uo goes high. With the phase difference signal uo set high, the flip-flop FFU is set at the trailing edge of the sampling clock signal φos, making the phase control signal up high. As a result, the dividing factor of the variable frequency dividing circuit VFD is set to 1/5, advancing the phase of the sampling clock signal φos as shown in the broken line of FIG. 5.

The sampling clock signal φos produced with the dividing factor of 1/5 is supplied as the counter clock signal cp to the counter circuit CTR. When the count value of the counter circuit CTR becomes "6" making the output ctr6 of the AND gate AG3 high, the flip-flop FFU is reset at the next trailing edge of the sampling clock signal φos. Then the phase control signal up goes low, causing the dividing factor of the variable frequency dividing circuit VFD to return to the center value of 1/6. The counter circuit CTR maintains the count value of "6" until the phase difference signal uo goes low.

As shown at (b) in FIG. 5, when the phase of the internal clock signal φs2 leads that of the reference input clock signal φs1 and the phase difference reaches a magnitude equivalent to six cycles of the reference frequency signal φo, the phase difference signal do goes high. With the phase difference signal do set high, the flip-flop FFD is set at the trailing edge of the sampling clock signal φos sending the phase control signal down going high. As a result, the dividing factor of the variable frequency dividing circuit VFD is changed to 1/7, delaying the phase of the sampling clock signal φos as shown by the dotted line of FIG. 5.

The sampling clock signal φos generated with the dividing factor of 1/7 is fed as the counter clock signal cp to the counter circuit CTR. When the count value of the counter circuit CTR reaches "6" and the output ctr6 of the AND gate AG3 becomes high, the flip-flop FFD is reset at the next trailing edge of the sampling clock signal φos. The phase control signal down then goes low, returning the dividing factor of the variable frequency dividing circuit VFD to the center value of 1/6. The counter circuit CTR maintains the count value of "6" until the phase difference signal do goes low.

As explained above, the digital PLL circuit of this embodiment generates the phase difference signal uo or do when the phase difference between the reference input clock signal φs1 and the internal clock signal φs2 reaches a magnitude equivalent to six cycles of the reference frequency signal φo. The phase difference signal uo or do is applied to the frequency dividing factor control circuit FDC which generates the phase control signal up or down that changes the dividing factor of the variable frequency dividing circuit VFD for the duration of six frequency-divided periods, i.e., six cycles of the sampling clock signal φos. With the dividing factor changed by six dividing periods, the phase of the internal clock signal φs2 is shifted by six cycles of the reference frequency signal φo, i.e., by an amount equal to the phase difference detected by the phase comparison circuit PFC.

Thus, the reference input clock signal φs1 and the internal clock signal φs2 are almost synchronized in phase at the leading edge of the next cycle. Thus, even in the event of temporary phase variation due to jitter after the digital PLL circuit is phase-locked, the amount of phase correction by the phase difference signals uo and do on the sampling clock signal φos and the internal clock signal φs2 is made small. This prevents the sampling timing of the A/D and D/A converters of oversampling type from being changed excessively, allowing quick phase synchronization of these signals. This in turn improves the S/N ratio of the communication system as a whole including the oversampling type A/D and D/A converters ADE.

As described in the above, this embodiment when applied to the digital PLL circuit used in MODEMs has the following advantages.

(1) The dividing factor of the variable frequency dividing circuit is normally set to the first dividing factor (1/6); and when the phase difference between the reference input clock signal and the internal clock signal reaches a magnitude equivalent to a specified number of cycles of the reference frequency signal φo (say six cycles), the dividing factor is changed to the second (1/5) or third (1/7) dividing factor according to the first or second phase difference signal (uo or do) for the duration of time equal to the same number of frequency-divided periods (six frequency-divided periods) as that specified number of reference frequency signals cycles used for phase difference check. This enables phase correction by an exact amount equal to the phase difference detected.

(2) Because of item (1), in correcting the phase (frequency) of the sampling clock signal, unnecessarily large changes are not made, i.e., the sampling timing of the oversampling type A/D and D/A converters is not changed excessively, so that the reference input clock signal φs1 and the internal clock signal φs2 are gradually brought into synchronism.

(3) Because of the above items (1) and (2), it is possible to prevent deterioration of the S/N ratio of the communication system including the oversampling type A/D and D/A converters which would otherwise result from temporary phase variation due to jitter.

Figure 6:
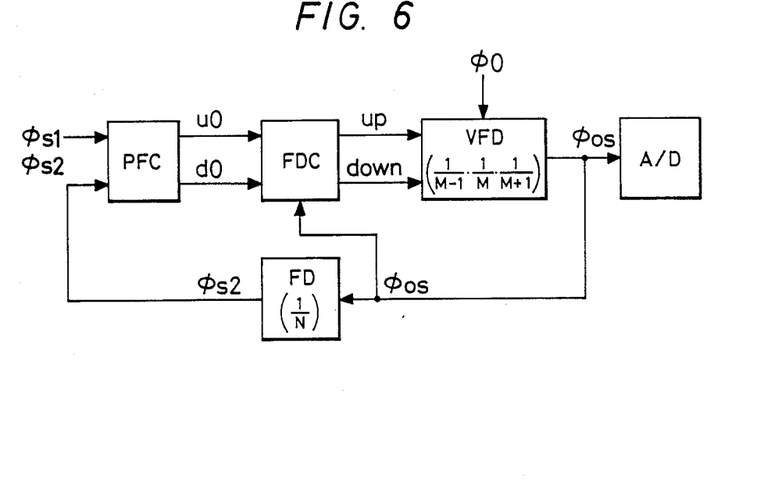
FIG. 6 is a block diagram showing a further embodiment of the PLL circuit as shown in FIG. 1.

FIG. 6 shows another embodiment of this invention in which improvement is made on the PLL circuit of FIG. 1.

The digital PLL circuit of this embodiment has a frequency dividing factor control circuit FDC installed between the phase comparison circuit PFC and the variable frequency dividing circuit VFD. The frequency dividing factor control circuit FDC generates phase control signals up and down according to the phase difference signals uo and do output from the phase comparison circuit PFC. These phase control signals up and down are set high only for such a short period of time as to change the dividing factor of the variable frequency dividing circuit for the duration of one frequency-divided period after the digital PLL circuit is phase-locked. When the phase difference between the reference input clock signal φs1 and the internal clock signal φs2 (the second internal clock signal) exceeds a specified magnitude, the phase difference signals uo and do are directly transferred as the phase control signals up and down. Thus, when temporary phase variations due to jitters occur after phase synchronization is made, it is possible to reestablish synchronism between the clock signals without excessively changing the sampling timing of the oversampling type A/D and D/A converters. This in turn improves the S/N ratio and reduces the phase recovering time and phase pull-in time when a relatively large phase variation occurs.

The dividing factor of the variable frequency dividing circuit VFD, as mentioned above, is changed to 1/5 or 1/7 only for the duration of one cycle of sampling clock signal φos, i.e., one frequency-divided period of the variable frequency dividing circuit VFD. With the phase control signal up or do held high, the phase of the sampling clock signal φos is advanced or delayed by one cycle of the reference frequency signal φo.

The sampling clock signal φs formed by the variable frequency dividing circuit VFD is fed to the A/D converter circuit A/D and also to the frequency dividing circuit FD where it is further divided by the fixed dividing factor of 1/128 to generate the internal clock signal φs2. The internal clock signal φs2 therefore has the center frequency of 9.6 kHz or 1/128 times 1.2288 MHz. As the dividing factor of the variable frequency dividing circuit VFD is changed for the duration of one cycle of the sampling clock signal φos, the phase of the internal clock signal φs2 is shifted by one cycle of the reference frequency signal φo.

Figure 7:
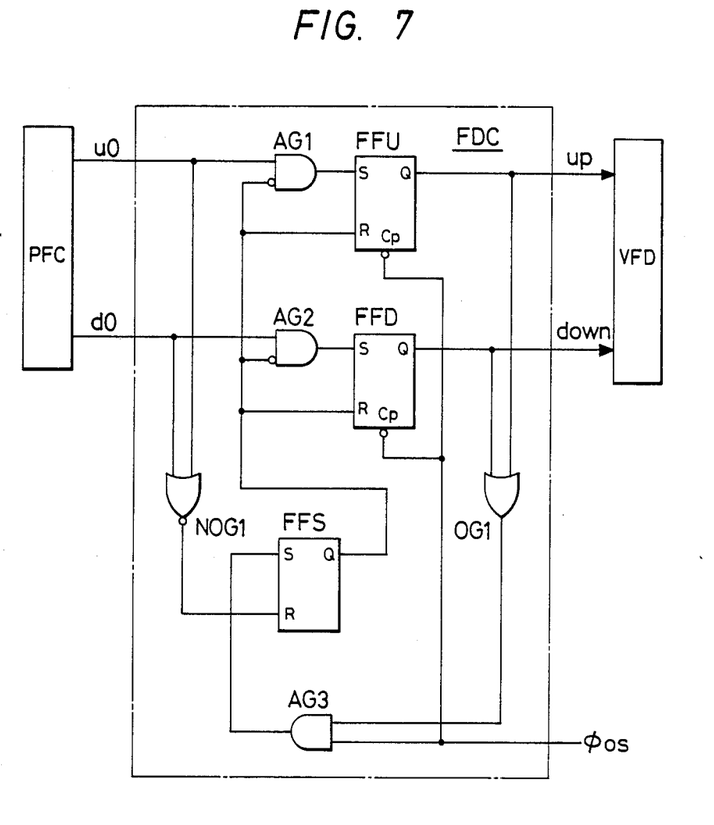
FIG. 7 is a circuitry showing one embodiment of the frequency dividing factor control circuit FDC as shown in FIG. 6.

FIG. 7 shows one example of the frequency dividing factor control circuit FDC in the digital PLL circuit as shown in FIG. 6. In this figure, the phase difference signals uo and do from the phase comparison circuit PFC are supplied to the associated AND gates AG1 and AG2 at one input terminal and also to the first and second input terminals of NOR gate NOG1. To the other input terminals of these AND gates AG1 and AG2 is supplied an inverted output of flip-flop FFS (described later). Thus, the output of the AND gates AG1 and AG2 goes high when the inverted output of the flip-flop FFS is high, i.e., the flip-flop FFS is in the reset state, and at the same time the corresponding phase difference signal uo or do is high.

The output of the AND gate AG1 is fed to the set input terminal of the flip-flop FFU. To the reset input terminal of the flip-flop FFU there is supplied a non-inverted output of the flip-flop FFS. The flip-flop FFU receives at its clock input terminal an inverted sampling clock signal φos. Now, when the output of the AND gate AG1 is high, i.e., the flip-flop FFS is in the reset state and the phase difference signal uo is high, then the flip-flop FFU is set at the high-to-low transition of the sampling clock signal φos. When the flip-flop FFS is set, the flip-flop FFU is reset at the trailing edge of the sampling clock signal φos. The non-inverted output of the flip-flop FFU is applied as the phase control signal up to the variable frequency dividing circuit VFD and also to one input terminal of OR gate OG1.

Similarly, the output of the AND gate AG2 is applied to the set input terminal of flip-flop FFD. At its reset terminal, the flip-flop FFD receives a non-inverted output of the flip-flop FFS. The flip-flop FFD receives at its clock input terminal an inverted signal of the sampling clock signal φos. Now, when the output of the AND gate AG2 is high, i.e., the flip-flop FFS is in the reset state and the phase difference signal do is high, the flip-flop FFD is set at the trailing edge of the sampling clock signal φos. When the flip-flop FFS becomes set, the flip-flop FFD is reset at the trailing edge of the sampling clock signal φos. The non-inverted output of the flip-flop FFD is fed as the phase control signal down to the variable frequency dividing circuit VFD and also to the other input terminal of the OR gate OG1.

The output of the OR gate OG1 is supplied to one input terminal of AND gate AG3. At the other input terminal the AND gate AG3 receives the sampling clock signal φos. The sampling clock signal φos is further inverted and supplied to the clock input terminals of the flip-flops FFU and FFD. The output of the AND gate AG3 is supplied to the set input terminal of the flip-flop FFS. At its reset terminal the flip-flop FFS receives the output of the NOR gate NOG1. The output of the flip-flop FFS, as described earlier, is sent to the reset input terminals of the flip-flops FFU and FFD and its inverted signal is fed to one input terminal of each of the AND gates AG1 and AG2.

Then, the flip-flop FFS is set when the output of the AND gate AG3 is high, i.e., when either the phase control signal up or down is high and the sampling clock signal φos goes high. With the flip-flop FFS set, the reset input terminals of the flip-flops FFU and FFD go high and the outputs of the AND gates AG1 and AG2, i.e., the set input terminals of the flip-flops FFU and FFD go low. As a result, the flip-flops FFU and FFD are reset at the trailing edge of the sampling clock signal φos. With these flip-flops FFU and FFD reset, the phase control signals up and down go low, causing the dividing factor of the variable frequency dividing circuit to return to the center value of 1/6.

The flip-flop FFS remains set until both of the phase differential signals uo and do go low. As the flip-flop FFS is reset, one input terminal of each of the AND gates AG1 and AG2 becomes high, putting the flip-flops FFU and FFD condition ready to be set by the next phase difference signals uo and do going high.

Now, the circuit operation is explained. When the phase comparison circuit PFC detects a phase difference between the reference input clock signal φs1 and the internal clock signal φs2 and makes the phase difference signal uo or do high, the corresponding flip-flop FFU or FFD in the frequency dividing factor control circuit FDC is set at the trailing edge of the sampling clock signal φos, causing the phase control signal up or down to go high. Then the dividing factor of the variable frequency dividing circuit VFD is changed to 1/5 or 1/7 at the leading edge of the sampling clock signal φos. As a result the phase of the sampling clock signal is advanced or delayed by one cycle of the first reference frequency signal φo. At the first leading edge of the sampling clock signal φos after the dividing factor has been changed, the flip-flop FFS is set, causing the flip-flops FFU and FFD to reset. The non-inverted outputs of the flip-flops FFU and FFD, i.e., the phase control signals up and down are set high only during one frequency-divided period or one cycle of the sampling clock signal φos in which the variable frequency dividing circuit VFD completes one counting operation with the dividing factor of 1/5 or 1/7. Since the flip-flop FFS remains set as long as the phase difference signal uo or do from the phase comparison circuit PFC is present, the dividing factor is changed once for the duration of one frequency-divided period by the pulse of phase difference signal uo or do going high.

Figure 8:
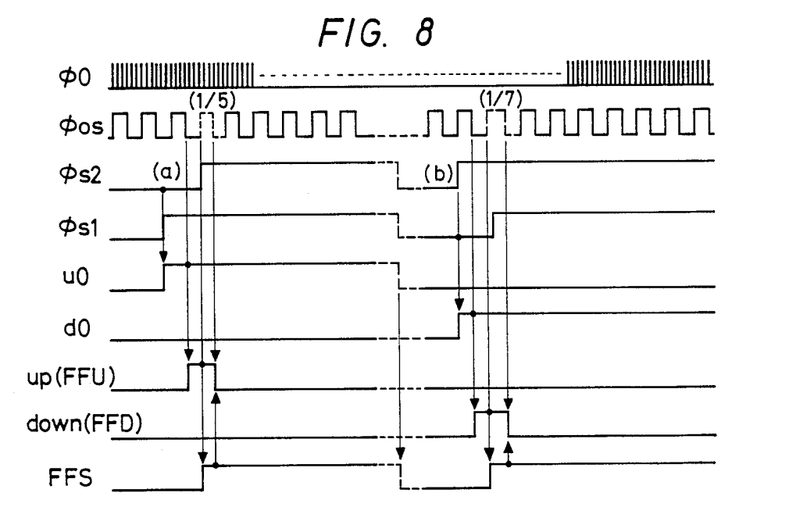
FIG. 8 is a timing waveform diagram showing the operation of the PLL circuit as shown in FIG. 6.

FIG. 8 shows the timing waveforms of the digital PLL circuit as shown in FIG. 6. Referring to this timing diagram, the outline of the phase control operation performed by the digital PLL circuit is described in the following.

In FIG. 8, the reference frequency signal φo has the frequency of 7.3728 MHz. The reference frequency signal φo is divided normally by the factor of 1/6 in the variable frequency dividing circuit VFD to form a sampling clock signal φs (first internal clock signal) with its center frequency of 1.2288 MHz. The sampling clock signal φos is divided by the fixed factor of 1/128 in the frequency dividing circuit FD to produce an internal clock signal φs2 with its center frequency of 9.6 kHz.

As shown at (a) of FIG. 8, when the internal clock signal φo2 lags the reference input clock signal φs1, the phase difference signal uo going high, the flip-flop FFU is set at the trailing edge of the sampling clock signal φos, causing the phase control signal up to go high. The phase control signal up changes the dividing factor of the variable frequency dividing circuit VFD to 1/5, which in turn advances the phases of the sampling clock signal φos and the internal clock signal φs2.

When the first sampling clock signal φos produced by the new dividing factor of 1/5 goes high, the flip-flop FFS of the frequency dividing factor control circuit FDC is set. This in turn causes the flip-flop FFU to reset at the trailing edge of the sampling clock signal φos, making the phase control signal up go low and the dividing factor return to the center value of 1/6.

On the other hand, as shown at (b) of FIG. 8, when the internal clock signal φs2 leads the reference input clock signal φs1, the phase difference signal do goes high. With the phase difference signal do set high, the flip-flop FFD is set at the trailing edge of the sampling clock signal φos, making the phase control signal down go high. The phase control signal down changes the dividing factor of the variable frequency dividing circuit to 1/7, which in turn delays the phases of the sampling clock signal φos and the internal clock signal φs2.

When the first sampling clock signal φos produced by the new dividing factor of 1/7 goes high, the flip-flop FFS in the frequency dividing factor control circuit FDC is set, causing the flip-flop FFD to reset at the trailing edge of the sampling clock signal φos. As a result the phase control signal down goes low, returning the dividing factor to the center value of 1/6.

As explained above, the digital PLL circuit of this embodiment has the frequency dividing factor control circuit FDC which accepts the phase difference signal uo and do from the phase comparison circuit PFC and which changes the dividing factor of the variable frequency dividing circuit VFD for the duration of one frequency-divided period in one cycle of the internal clock signal φs2. Therefore, the phases of the sampling clock signal φos supplied to the oversampling type A/D converter circuit and the internal clock signal φs2 are gradually corrected over a plurality of cycles of internal clock signal φs2. This gradual correction of phase makes it possible to reestablish synchronism when a temporary phase variation occurs due to jitters the digital PLL circuit is phase-locked, without changing the sampling timing of the oversampling type A/D and D/A converters too sharply. This also contributes to improving the S/N ratio of the communication system.

The digital PLL circuit of this embodiment has a phase difference detecting circuit (not shown) in the frequency dividing factor control circuit FDC. The phase difference detecting circuit, when the phase difference between the reference input clock signal φs1 and the internal clock signal φs2 exceeds a certain magnitude, transfers the phase difference signal uo or do directly to the variable frequency dividing circuit VFD as the phase control signal up or down. Thus, as the phase difference signal uo or do goes high, the dividing factor of the variable frequency dividing circuit VFD is set to 1/5 or 1/7 and held there continuously while the phase difference signal uo or do remains high, thus allowing the phase of the sampling clock signal φos and the internal clock signal φs2 to be changed to a relatively large extent at one time. This in turn shortens the phase pull-in time or phase recovering time during the start of the digital PLL circuit or when the phase difference after phase-locking between the reference input clock signal φs1 and the internal clock signal φs2 becomes large.

Figure 9:
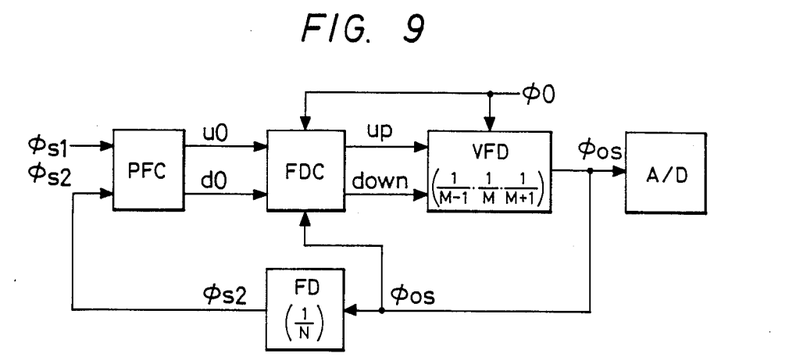
FIG. 9 is a block diagram showing still another embodiment of the PLL circuit as shown in FIG. 1.

FIG. 9 shows the circuitry of still another embodiment of this invention with improvement made on the PLL circuit as shown in FIG. 1.

The PLL circuit of this embodiment has a frequency dividing factor control circuit FDC installed between the phase comparison circuit PFC and the variable frequency dividing circuit VFD. The frequency dividing factor control circuit FDC receives the phase difference signals uo and do from the phase comparison circuit PFC and also the reference frequency signal φo and the sampling clock signal φos (first internal clock signal). The phase comparison circuit PFC compares the phases (frequencies) of the reference input clock signal φs1 and the internal clock signal φs2 (second internal clock signal) and sets the first or second phase difference signal uo or do to high level and keeps it high for the duration of time corresponding to the phase difference detected. The frequency dividing factor control circuit FDC counts the time width of the phase difference signal uo or do sent from the phase comparison circuit PFC and holds the first or second phase control signal up or down high for the duration lasting the same number of frequency-divided periods as the count number. As a result, the dividing factor of the variable frequency dividing circuit VFD is changed for the frequency-divided periods corresponding to the phase difference between the reference input clock signal φs1 and the internal clock signal φs2, thereby enabling quick and accurate phase correction.

Figure 10:
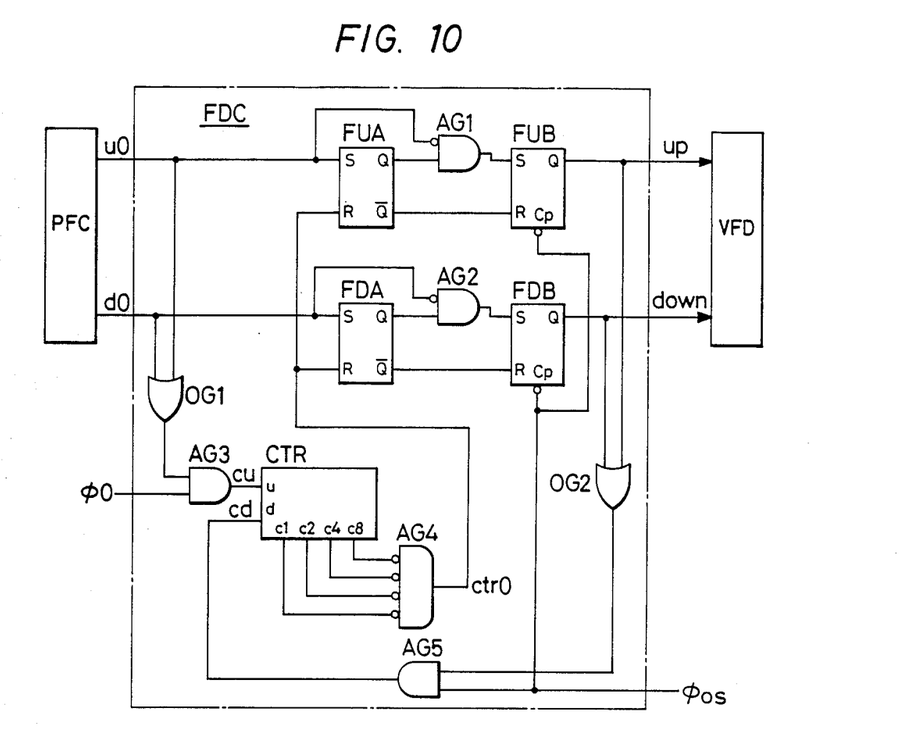
FIG. 10 is a circuit showing one embodiment of the frequency dividing factor control circuit FDC as shown in FIG. 9.

FIG. 10 shows the circuitry of the frequency dividing factor control circuit FDC in the digital PLL circuit of FIG. 9. In this figure, the phase difference signals uo and do from the phase comparison circuit PFC are supplied to the set input terminals S of the corresponding flip-flops FUA and FDA and also to the first and second input terminals of the OR gate OG1. The inverted phase difference signals uo and do are fed to one input terminal of each of AND gates AG1 and AG2. The AND gates AG1 and AG2 receive at the other input terminals the non-inverted output of the flip-flops FUA and FDA. The outputs of the AND gates AG1 and AG2 are fed to the set input terminals S of the corresponding flip-flops FUB and FDB.

At their reset input terminals R the flip-flops FUA and FDA receive the output ctr0 of the AND gate AG4. The inverted outputs of the flip-flops FUA and FDA are given to the reset input terminals R of the corresponding flip-flops FUB and FDB. To the clock input terminals Cp of the flip-flops FUB and FDB there is supplied the inverted sampling clock signal φos (first internal clock signal). The non-inverted outputs of the flip-flops FUB and FDB are supplied as the phase control signal up or down to the variable frequency dividing circuit VFD and also to the first and second input terminals of OR gate OG2.

The flip-flops FUA and FDA are of reset preferential type. They are set when the output ctr0 of the AND gate AG4 is low and the corresponding phase difference signal uo or do is high. The flip-flops FUB and FDB are set at the high-to-low transition of the sampling clock signal φos when the phase difference signal uo or do goes high setting the flip-flops FUA and FDA and then returns to low level again. The flip-flops FUA and FDA are reset when the output ctr0 of the AND gate AG4 goes high. This is followed by the flip-flops FUB and FDB resetting at the trailing edge of the sampling clock signal $\phi$os.

The output of the OR gate OG1 is fed to one input terminal of the AND gate AG3. At its other input terminal the AND gate AG3 accepts the reference frequency signal $\phi$o. The output of the AND gate AG3 is sent as the count-up signal cu to the count-up signal input terminal u of the up/down counter circuit CTR. The reference frequency signal $\phi$o coming while the phase difference signal uo or do is high is supplied to the up/down counter circuit CTR as the count-up signal cu. The output of the OR gate OG2 is applied to one input terminal of the AND gate AG5. At its other input terminal the AND gate AG5 accepts the sampling clock signal $\phi$os. The inverted signal of the sampling clock signal $\phi$os is fed to the clock input terminal Cp of the flip-flops FUB and FDB. The output of the AND gate AG5 is sent as the count-down signal cd to the count-down signal input terminal d of the up/down counter circuit CTR. Then, the sampling clock signal $\phi$os that arrives at AG5 while the phase control signal up or down given from the frequency dividing factor control circuit FDC to the variable frequency dividing circuit VFD is high, is supplied to the up/down counter circuit CTR as the count-down signal cd.

The four-bit outputs c1, c2, c4, c8 of the up/down counter CTR are inverted and supplied to the first through fourth input terminals of the AND gate AG4. The output ctr0 of the AND gate AG4 goes high when the four outputs c1, c2, c4, c8 of the up/down counter circuit CTR are all logic "0", i.e., when the count value of the counter circuit CTR is "0" in decimal representation.

When the phase comparison circuit PFC detects the phase difference between the reference input clock signal $\phi$s1 and the internal clock signal $\phi$s2 and the phase difference signal uo or do goes high, the up/down counter circuit CTR counts up the reference frequency, signal $\phi$o coming while the phase difference signal is high. As the up/down counter circuit CTR starts counting up and the output ctr0 of the AND gate AG4 goes low, the flip-flop FUA or FDA corresponding to the phase difference signal uo or do is set. The up/down counter circuit CTR is counted up while the phase difference signal uo or do remains high, thereby representing the phase difference between the reference input clock signal $\phi$s1 and the internal clock signal $\phi$s2 with the number of cycles of the reference frequency signal $\phi$o.

When the phase difference signal uo or do goes low, the count-up signal cu stops, thereby bringing the count-up operation of the up/down counter circuit CTR to a halt and causing the flip-flop FUB or FDB to be set at the trailing edge of the sampling clock signal $\phi$os. This brings the phase control signal up or down to the high level, changing the dividing factor of the variable frequency dividing circuit VFD to 1/5 or 1/7. With the phase control signal up or down held high, the output of the OR gate OG2 goes high supplying the sampling clock signal $\phi$os coming thereafter—the sampling clock signal $\phi$os generated with the changed dividing factor of 1/5 or 1/7—to the up/down counter circuit CTR as the count-down signal cd. The up/down counter circuit CTR is counted down by the count-down signal cd.

As the up/down counter circuit CTR is counted down and its count value becomes "0", then the output ctr0 of the AND gate AG4 goes high resetting the flip-flop FUA or FDA. With the flip-flop FUA or FDA reset, the corresponding flip-flop FUB or FDB is reset at the trailing edge of the sampling clock signal $\phi$os, causing the phase control signal up or down to go low. As a result the dividing factor of the variable frequency dividing circuit VFD returns to 1/6 and the output of the OR gate OG2 goes low stopping the count-down signal cd to the up/down counter circuit CTR. The count value of the up/down counter circuit CTR is kept at "0" until the phase difference signal uo or do goes high next.

In other words, the up/down counter circuit CTR is operated to connect up in response to the reference frequency signal $\phi$o to a number corresponding to the magnitude of the phase difference between the reference input clock signal $\phi$s1 and the internal clock signal $\phi$s2. And as the phase control signal up or down goes high changing the dividing factor to 1/5 or 1/7, the up/down counter circuit CTR begins to count down in response to the sampling clock signal $\phi$os generated after the dividing factor has changed to 1/5 or 1/7. When the count-down operation brings the count value to "0", i.e., when the same number of the sampling clock signals $\phi$os as the count-up number has been generated, the phase control signal up or down goes low, causing the dividing factor of the variable frequency dividing circuit VFD to return to 1/6. Thus, the dividing factor has been changed to 1/5 or 1/7 for the duration equal to the same number of frequency-divided periods as the count-up number of reference frequency signal cycles that corresponds to the phase difference between the reference input clock signal $\phi$s1 and the internal clock signal $\phi$s2. This means that the phases of the sampling clock signal $\phi$os and the internal clock signal $\phi$s2 are corrected and shifted by an amount equal to the phase difference between the reference input clock signal $\phi$s1 and the internal clock signal $\phi$s2.

Figure 11:
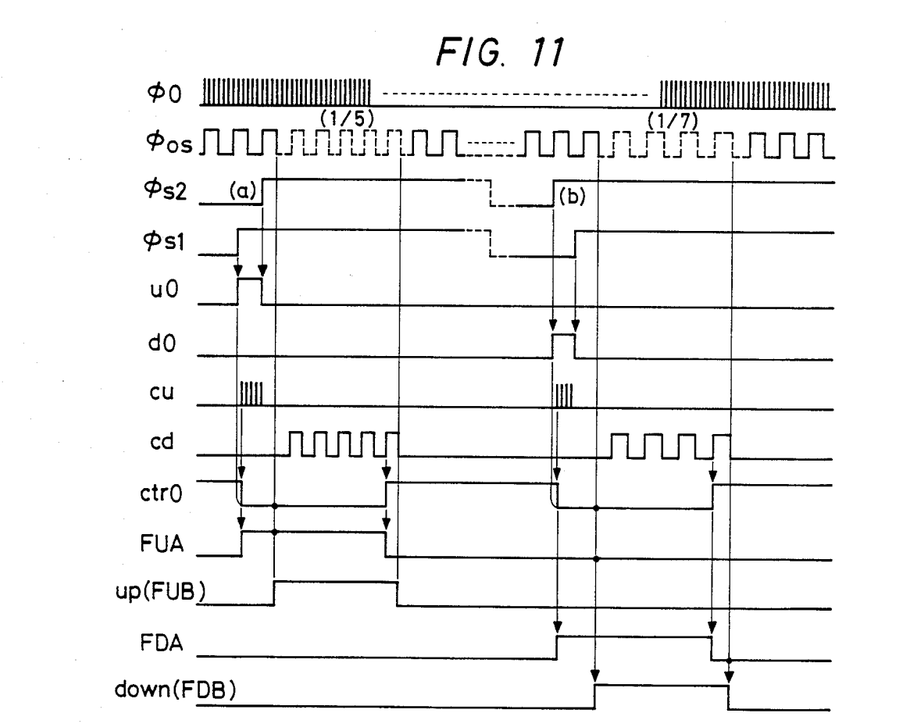
FIG. 11 is a timing waveform diagram showing the operation of the PLL circuit of FIG. 9.

FIG. 11 shows the timing waveforms of the digital PLL circuit of FIG. 9. By referring to the timing waveforms, the outline of the phase control operation performed by the digital PLL circuit of this embodiment is explained.

In FIG. 11, the reference frequency signal $\phi$o has the frequency of 7.3728 MHz. The reference frequency signal $\phi$o is divided in the variable frequency dividing circuit VFD normally by the factor of 1/6 to produce the sampling clock signal $\phi$os with the center frequency of 1.2288 MHz. The sampling clock signal $\phi$os is divided by the frequency dividing circuit FD by the fixed factor of 1/128 to generate the internal clock signal $\phi$s2 with the center frequency of 9.6 kHz.

As shown at (a) of FIG. 11, when the internal 15 clock signal $\phi$s2 lags the reference input clock signal $\phi$s1, the phase difference signal uo is held high for the duration corresponding to the phase difference detected. With the phase difference signal uo held high, the count-up signal cu is generated in synchronism with the reference frequency signal $\phi$o to count up the up/down counter circuit CTR. In a normal condition, the count value of the up/down counter circuit CTR is set to "0" and the output ctr0 of the AND gate AG4 is held high. As the up/down counter CTR begins to count up, the output ctr0 of the AND gate AG4 goes low, setting the flip-flop FUA.

Then, as the phase difference signal uo returns the low level, the flip-flop FUB is set at the trailing edge of the sampling clock signal $\phi$os, setting the phase control signal up high. This changes the dividing factor of the variable frequency dividing circuit VFD to 1/5, advancing the phase of the sampling clock signal φos as shown by the dotted line in FIG. 11.

The sampling clock signal φos generated with the new dividing factor of 1/5 is supplied to the up/down counter CTR as the count-down signal cd, starting the count-down. When the count-down brings the count value of the up/down counter circuit CTR to "0", the output ctr0 of the AND gate AG4 goes high, resetting the flip-flop FUA. This is followed by the flip-flop FUB resetting at the next trailing edge of the sampling clock signal φos. As a result, the phase control signal up goes low, returning the dividing factor of the variable frequency dividing circuit VFD to the center value of 1/6. With the phase control signal up held low, the count-down signal cd is stopped and the counter circuit CTR maintains the count value of "0".

On the other hand, when the internal clock signal φs2 leads the reference input clock signal φs1 as shown at (b) in FIG. 11, the phase difference signal do is held high for the duration corresponding to the phase difference detected. The phase difference signal do causes the count-up signal cu to be generated and supplied to the up/down counter circuit CTR, starting the count-up of the counter circuit CTR. As the up/down counter circuit CTR begins to be counted up, the output ctr0 of the AND gate AG4 goes low setting the flip-flop FDA.

Then, when the phase difference signal do returns to the low level, the flip-flop FDB is set at the trailing edge of the sampling clock signal φos, bringing the phase control signal down high. This changes the dividing factor of the variable frequency dividing circuit VFD to say 1/7, delaying the phase of the sampling clock signal φos as shown by the dotted line in FIG. 11.

The sampling clock signal φos generated with the new dividing factor of 1/7is supplied to the up/down counter circuit CTR as the count-down signal cd, starting the count-down of the counter circuit CTR. When the count-down brings the count value to "0", the output ctr0 of the AND gate AG4 goes high, resetting the flip-flop FDA. This is followed by the flip-flop FDB being reset at the next trailing edge of the sampling clock signal φos. As a result, the phase control signal down goes low, returning the dividing factor of the variable frequency dividing circuit VFD to the center value of 1/6. With the phase control signal down going low, the count-down signal cd is stopped, bringing the counter circuit CTR to a halt with the count value kept at "0".

As explained above, with the digital PLL circuit of this embodiment, the phase difference signal uo or do is held high for the duration corresponding to the phase difference between the reference input clock signal φs1 and the internal clock signal φs2. While the phase difference signal uo or do is high, the up/down counter circuit CTR of the frequency dividing factor control circuit FDC is counted up by the reference frequency signal φo. When the phase difference signal returns to low level, the phase control signal up or down goes high. While the phase control signal up or down is high, the up/down counter circuit CTR is counted down by the sampling clock signal φos until the count value of the counter circuit CTR becomes "0", at which time the phase control signal up or down is held low. In other words, the dividing factor of the variable frequency dividing circuit VFD is changed for the duration equal to the same number of frequency-divided periods as the count-up number of reference frequency signal cycles that corresponds to the phase difference between the reference input clock signal φs1 and the internal clock signal φs2, thereby shifting the phases of the sampling clock signal φos and the internal clock signal φs2. This configuration of the PLL circuit assures that the phase correction of the sampling clock signal φos utilizing the phase difference signal uo and do is performed to the minimum extent required. This in turn reduces the phase recovery time when a temporary phase variation occurs due to jitter after the digital PLL circuit is phase-locked. Since the sampling timing of the oversampling type A/D and D/A converters ADE are not changed too sharply in reestablishing synchronism, it is possible to prevent the S/N ratio of the communication system including the A/D and D/A converters ADE from being deteriorated by jitter.

In the foregoing description, we offered explanation mainly on those embodiments applied to the digital PLL circuit of a MODEM, in which the invention has originally been directed. It is noted, however, that the invention is not limited to these applications but may also be applied to digital PLL circuits used in other kinds of communication equipment. This invention can widely be applied to digital PLL circuits which generate an internal clock signal in synchronism with a reference input clock signal by frequency-dividing the reference frequency signal and also to equipment incorporating such PLL circuits.

We claim:

1. An A/D converter apparatus, comprising: a sampling signal generating means for generating an oversampling signal and an internal sampling signal; converter means for converting an input analog signal into a digital signal in synchronism with said oversampling signal; and decimator means for performing a specified decimation operation on said digital signal in synchronism with said internal sampling signal; wherein said sampling signal generating means includes means for maintaining the frequencies of the oversampling signal and the internal sampling signal in a specified relationship.

2. An A/D converter apparatus comprising:
a sampling signal generating means for generating an oversampling signal and an internal sampling signal; converter means for converting an input analog signal into a digital signal in synchronism with said oversampling signal; and decimator means for performing a specified decimation operation on said digital signal in synchronism with said internal sampling signal; wherein said sampling signal generating means includes means for maintaining the frequencies of the oversampling signal and the internal sampling signal in a specified relationship, and wherein the sampling signal generating means is controlled by an external sampling signal supplied form outside the A/D converter apparatus.

3. An A/D converter apparatus as set forth in claim 2, wherein said sampling signal generating means comprises: phase comparison means for detecting a phase difference between the external sampling signal and the internal sampling signal, and an oversampling signal generating circuit for generating said oversampling signal according to a signal representing the phase difference output from the phase comparison means.

4. An A/D converter apparatus as set forth in claim 3, wherein said sampling signal generating means further comprises: a frequency dividing circuit for generating said internal sampling signal by dividing said oversampling signal.

5. An A/D converter apparatus as set forth in claim 4, wherein said oversampling signal generating circuit includes: a variable frequency dividing circuit for dividing a reference frequency signal according to said phase difference signal.

6. An A/D converter apparatus as set, forth in claim 5, wherein said phase comparison circuit includes means for generating the phase difference signal when the phase difference between the external sampling signal and the internal sampling signal reaches a magnitude equivalent to a specified number of the reference frequency signals.

7. An A/D converter apparatus as set forth in claim 6, further comprising: frequency dividing factor control means for controlling the dividing factor of the variable frequency dividing circuit for a specified period according to said phase difference signal.

8. An A/D converter apparatus asset forth in claim 7, wherein said frequency dividing factor control means includes means for generating a frequency dividing factor control signal for switching the dividing factor of the variable frequency dividing circuit from a first factor to a second factor.

9. An A/D converter apparatus as set forth in claim 2, including means for generating said external sampling signal according to the digital output signal from said decimator means.

10. An A/D converter apparatus as set forth in claim 4, wherein the frequency dividing circuit has a fixed dividing factor.

11. An A/D converter apparatus as set forth in claim 5, wherein an output signal of the variable frequency dividing circuit is said oversampling signal and the frequency of the oversampling signal is increased as the frequency of the external sampling signal increases.

12. An MODEM (modulator/demodulator) comprising an A/D converter apparatus and a digital signal processor apparatus; the A/D converter apparatus including: sampling signal generating means for generating an oversampling signal and an internal sampling signal; converter means for converting an input analog signal into a digital signal in synchronism with said oversampling signal; and decimating means for performing a specified decimation operation on the digital signal in synchronism with the internal sampling signal; whereby the sampling signa generating means includes means for maintaining the frequencies of the oversampling signal and the internal sampling signal in a specified relationship.

13. A MODEM comprising:
an A/D converter apparatus; and
a digital signal processor apparatus;
said A/D converter apparatus including sampling signal generating means for generating an oversampling signal and an internal sampling signal, converter means for converting an input analog signal into a digital signal in synchronism with said oversampling signal, and decimating means for performing a specified decimation operation on the digital signal in synchronism with the internal sampling signal;
wherein said sampling signal generating means includes means for maintaining the frequencies of the oversampling signal and the internal sampling signal in a specified relationship; and
wherein the sampling signal generating means is controlled by an external sampling signal supplied from the digital signal processor apparatus.

14. A MODEM as set forth in claim 13, wherein the sampling signal generating means comprises: a phase comparison circuit for detecting a phase difference between the external sampling signal and the internal sampling signal and an oversampling signal generating circuit for generating the oversampling signal according to a signal representing the phase difference output from the phase comparison circuit.

15. A MODEM as set forth in claim 14, wherein the sampling signal generating means further comprises: a frequency dividing circuit for generating the internal sampling signal by dividing the oversampling signal.

16. A MODEM as set forth in claim 15, wherein the oversampling signal generating means includes: a variable frequency dividing circuit for dividing a reference frequency signal according to the phase difference signal.

17. A MODEM as set forth in claim 16 wherein said A/D converter apparatus and said digital signal processor apparatus is included within a single semiconductor substrate.

* * * * *